United States Patent
Hirschfeld et al.

(10) Patent No.: US 6,660,614 B2
(45) Date of Patent: Dec. 9, 2003

(54) METHOD FOR ANODICALLY BONDING GLASS AND SEMICONDUCTING MATERIAL TOGETHER

(75) Inventors: Deidre A. Hirschfeld, Socorro, NM (US); W Kent Schubert, Albuquerque, NM (US); Chad S. Watson, Socorro, NM (US)

(73) Assignee: New Mexico Tech Research Foundation, Socorro, NM (US)

( * ) Notice: Subject to any disclaimer, the term of this patent is extended or adjusted under 35 U.S.C. 154(b) by 14 days.

(21) Appl. No.: 09/849,127

(22) Filed: May 4, 2001

(65) Prior Publication Data

US 2003/0092243 A1 May 15, 2003

(51) Int. Cl.[7] .......................... H01L 21/30; H01L 21/46
(52) U.S. Cl. ........................................ 438/455; 438/455
(58) Field of Search ................................ 438/455, 456, 438/457, 458, 459

(56) References Cited

U.S. PATENT DOCUMENTS

| | | |
|---|---|---|
| 3,397,278 A | 8/1968 | Pomerantz |
| 3,417,459 A | 12/1968 | Pomerantz et al. |
| 4,142,945 A | 3/1979 | Dunn et al. |
| 4,197,171 A | 4/1980 | Dunn |
| 4,230,256 A | 10/1980 | Dunn et al. |
| 5,141,148 A | 8/1992 | Ichiyawa |
| 5,820,648 A | 10/1998 | Akaike et al. |
| 5,938,911 A | 8/1999 | Quenzer et al. |
| 5,989,372 A | 11/1999 | Momoda et al. |
| 6,020,215 A | 2/2000 | Yagi et al. |

FOREIGN PATENT DOCUMENTS

| | | | | |
|---|---|---|---|---|
| DE | WO 91/07359 | * | 5/1991 | ........... C03C/27/02 |

OTHER PUBLICATIONS

Anodic Bonding at Low Temperatures using Laser Microstructurable Li–Doped Glass, *Fourth International Symposium on Semiconductor Wafer Bonding: Science, Technology, and Applications*, Eds. U. Goselle, et al. Electrochemical Society: Pennington (1998) 222–228.

Sensors and Actuators A 46–47 (1995) 113–120.

Sensors and Actuators A 64 (1998) 95–100.

Integrated Sensor Wafer–Level Packaging, Sarah A. Audet*, Katrina M. Endenfeld**, Notorola, Inc.

Bonding of Structured Wafers, H Baumann, S. Mack *, H. Munzel.

Sensors and Actuators A 55 (1996) 201–209.

Field Assisted Glass–Metal Sealing, Journal of Applied Physics, vol. 40, No. 10, Sep. 1969.

Anodic Wafer Bonding, E. Obermeier, Technical University of Berlin, Microsensor and Microactuator Center, Gustav–Meyer–Allee 25, D–13355 Berlin, Germany.

Anodic bonding technique under low temperature and low voltage using evaporated glass, Woo–Beom Choi, Byeong–Kwon Ju, and Yun–Hi Lee.

Silicon–to–silicon wafer bonding using evaporated glass, Steen Weichel, Roger de Reus*, Michael Lindahl.

* cited by examiner

*Primary Examiner*—Amir Zarabian
*Assistant Examiner*—Toniae M. Thomas
(74) *Attorney, Agent, or Firm*—R W Becker & Associates; R W Becker

(57) ABSTRACT

A method is provided for anodically bonding glass and semiconducting material. A glass sample is immersed in a molten salt bath for a fixed period of time to modify the surface of the glass sample via ion exchange. The salt is a lithium salt or a proton source. After the glass sample is removed from the salt bath, the glass sample and semiconducting material are placed onto one another, and are then heated to a temperature of between 100° C. and 500° C. While at this temperature, a potential is applied across the glass and semiconducting material for a fixed period of time to effect anodic bonding together of the glass and semiconducting material.

11 Claims, No Drawings

METHOD FOR ANODICALLY BONDING GLASS AND SEMICONDUCTING MATERIAL TOGETHER

BACKGROUND OF THE INVENTION

The present invention relates to a method for the anodic bonding together of glass and semiconducting material.

Anodic bonding is a relatively low-temperature process in which semiconducting materials are hermetically sealed to glass for use in microelectro-mechanical sensor (MEMS) devices. Anodic bonding produces strong hermetic seals which protect the device from premature failure due to interactions with corrosive environments, externally applied mechanical stresses, and fluctuations in internal pressure. As a result, MEMS devices are able to sense different magnitudes of the same stimuli without compromising the original response characteristics to which the integrated circuitry was normalized.

Several types of commercial glasses have been used to anodically bond to silicon or other metals, such as Pyrex 7740/7070/1729/9626, Tempax and Hoya SD-2 glass. In the past, methods to reduce the anodic bonding temperature have focused on either the development of new glasses or the application of a thin glass film interlayer.

A recent study utilized a lithium aluminosilicate-β quartz glass ceramic to lower the anodic bonding temperature to silicon. Successful bonds were reported at temperatures as low as 160° C., however, the reported strength was only ~2.5 MPa. Typical anodic bond strengths for Pyrex 7740 range between 10–20 MPa. Successful integration of this glass ceramic into MEMS devices has not been reported. Another study focused on the development of a lithium borosilicate glass in order to lower anodic bonding temperatures to 200° C. when a voltage of 2000VDC was applied. V. Baier, et al "Anodic Bonding at Low Temperatures using Laser Microstructurable Li-Doped Glass," *Fourth International Symposium on Semiconductor Wafer Bonding: Science, Technology, and Applications,* Eds. U. Goselle, et al Electrochemical Society: Pennington (1998) 222–228. The authors did not report bond strength nor has this glass been used as a cover by the MEMS industry. It is assumed that the cost of these glasses makes them unlikely candidates for replacement of Pyrex 7740.

Intermediate thin films of sputtered or evaporated sodium borosilicate glass on silicon substrates have been used to lower anodic bonding temperatures. However, with this method, additional processing steps are required before bonding can proceed. For instance, the application of the thin film is slow and an annealing step (>300° C.) is necessary in order to reduce the residual stresses in the film. Unfortunately, in many of these studies, bond strengths were not reported. One study, however, was able to successfully bond silicon-to-silicon using evaporated Pyrex 7740 at temperatures as low as 225° C. Reported bond strength was relatively high at 30 MPa, but the bonding procedure lasted between 2–3 hours.

Typically Pyrex 7740 is used as the glass cover, because it is commercially available, relatively inexpensive, easy to bond, has a similar coefficient of thermal expansion to that of silicon and acts as an insulator so only low levels of parasitic capacitance may be introduced into the package. With the development of new glasses, the same criteria must be met. However, the temperatures currently used for this bonding technique typically range between 300–450° C. for Pyrex. At temperatures above 280° C., thermal stresses are introduced into the package due to the thermal expansion mismatch between silicon and Pyrex causing the package to warp or bow. With the introduction of thermal stresses into extremely sensitive MEMS devices, the reliability and lifetime of the product is reduced. Also of concern is the fact that at these elevated temperatures, temperature-sensitive electronics and low melting point materials integrated into the MEMS device are susceptible to damage.

Further discussion of the prior art of anodic bonding can be found in U.S. Pat. Nos. 3,417,459 and 3,397,278 to D. I. Pomerantz, et al.

It is therefore an object of the present invention to provide an improved low temperature method for the anodic bonding of glass to semiconducting material, especially silicon.

BRIEF DESCRIPTION OF THE DRAWINGS

This object, and other objects and advantages of the present invention, will appear more clearly from the following specification in conjunction with the accompanying schematic drawings, in which:

FIG. 1 shows an ion exchange apparatus for the surface modification of glass pursuant to the method of the present invention;

FIG. 2 illustrates one exemplary embodiment of an anodic bonding apparatus; and

FIG. 3 is a graph in which temperature is plotted against time to illustrate the anodic bond of untreated Pyrex wafers.

SUMMARY OF THE INVENTION

The method of the present invention for anodically bonding glass and semiconducting material together are characterized primarily by immersing a glass sample in a molten salt bath for a fixed period of time to modify the surface of the glass sample via ion exchange, wherein the salt is a lithium salt or a proton source; the glass sample is then removed from the salt bath and the glass sample and semiconducting material are placed onto one another; the glass and semiconducting material are then heated to a temperature of between 100° C. and 500° C.; finally, at this temperature, a potential is applied across the glass and semiconducting material for a fixed period of time to effect anodic bonding together of the glass and the semiconducting material.

Pursuant to the present invention, an ion exchange technique is first used to partially replace sodium-for-lithium or sodium-for-hydrogen in glass to prepare the glass for low temperature anodic bonds.

In particular, pursuant to the present invention a new method is provided to lower the temperature at which anodic bonds can be produced between glass and a semiconducting material, such as, by way of example, silicon or gallium arsenide. The ion exchange techniques are used to place highly mobile ions into the surface of the glass in order to lower the bonding temperature, especially to below 280° C. As indicated, the ion exchange is accomplished by placing glass into a molten salt bath of, for example, lithium nitrate for a specified period of time and at a specified temperature to allow the highly mobile lithium ions to penetrate the surface and exchange with less mobile sodium ions. Alternatively, ion exchange can be accomplished by placing glass in a molten bath of, for example, ammonium hydrogen sulfate for a specified period of time and at a specified temperature to allow the protons to penetrate the surface and exchange with sodium ions. As a consequence, the new ions are concentrated at the surface of the glass, thus allowing for anodic bonds at temperatures below, for example, 280° C.

Further specific features of the present invention will be described in detail subsequently.

DESCRIPTION OF PREFERRED EMBODIMENTS

With regard to the present invention, it is important to note that the salts utilized for the ion exchange process are lithium salts or a proton source. Although it is contemplated that such salts can include ammonium hydrogen sulfate, lithium nitrate, lithium sulfate, other lithium salts, and protonating salts, for the purpose of the experiments conducted, ammonium hydrogen sulfate and lithium nitrate were used.

A schematic of the ion exchange assembly utilized in experiments is shown in FIG. 1 and is indicated generally by the reference numeral 20. In experiments conducted, a crucible 21 was placed on a hot plate 22. A molten salt bath 23 was prepared in the crucible 21. In tests that were conducted, 20 grams of either lithium nitrate or ammonium hydrogen sulfate were used to prepare the molten salt bath. After an appropriate temperature of the molten salt bath was reached, for example of from 145–600° C., glass samples 24 were placed into the molten salt ion exchange bath. Appropriate glass can be soda silicate, soda lime silicate, boro silicate, and alumino silicate glass. In the tests that were conducted, the glass samples 24 were Pyrex 7740.

The glass samples 24 were soaked for a specified period of time, for example 0.01 to 24 hours. The samples were then taken out of the salt bath and air-cooled to room temperature. They were then thoroughly rinsed with deionized water. The glass samples 24 could also be etched for cleaning the surface thereof prior to being subjected to anodic bonding. For example, a 50/50 by volume solution of nitric acid and sulfuric acid, for example 20 ml of each, could be used for the etch. The following Table 1 shows the ranges of temperature and time utilized for the lithium and proton exchange treatments of the glass samples 24.

TABLE 1

| Treatment | Temperature (° C.) | Time (h) |
| --- | --- | --- |
| Lithium Nitrate | 264–600 | 0.01–24.0 |
| Ammonium Hydrogen Sulfate | 145–350 | 0.01–24.0 |

FIG. 2 shows an apparatus used for laboratory testing of the present invention. The anodic bonding apparatus of FIG. 2 is indicated generally by the reference numeral 40.

With the anodic bonding apparatus 40 utilized in one set of experiments, to minimize temperature gradients a ceramic-topped hot plate 41 was housed in an acrylic tube and lid 42. Leads 43 and 44 of a voltage source 45 were connected to gold-plated spring-loaded contacts in such a manner that the positively biased contact 43 was pressed against a graphite block 47, and the negatively biased contact 44 was pressed against a glass sample 48. It should be noted that with respect to the cathode, a gold-plated contact was used because it is non-blocking. In addition, for purposes of the experiments conducted, the contact was concentrated at a point so that the formation of the anodic bond could be easily observed and recorded.

The anodic bonding temperature was measured using a K-type thermocouple (indicated by the reference numeral 49) and an Omega HH81 thermocouple indicator. The highest temperature reading measured on the graphite block was used as the temperature at which the anodic bond took place. After the appropriate temperature, for example from 100° C. to 500° C., was reached, a potential was applied across the materials being bonded to one another, namely the glass sample 48 and the semiconducting material 50, which in the embodiment illustrated in FIG. 2 is a silicon wafer. The power source utilized in the experiments was a Fluke Model 408B; any appropriate power source could of course be used.

In the experiments conducted, in order to protect the ceramic-topped hot plate from arcing during the application of voltage, thin alumina plates were placed between the hot plate 41 and the graphite block 47. It should be noted that the graphite block was used because it does not inject ions into the system; in other words, the graphite block acts as a blocking anode.

The relative robustness of the anodic bond that was produced using the apparatus of FIG. 2 was determined by the forced insertion of a razor blade into the interface between the glass sample 48 and the silicon wafer 50. If the bond did not fail, or if the Pyrex broke leaving a layer of glass attached to the silicon wafer, then the bond was rated a 100% anodic bond. If the glass sample 48 and silicon wafer 50 separated completely, then the bond was considered electrostatic and 0% bond was recorded. If a portion of the glass sample 48 adhered to the silicon wafer 50, then that percentage was recorded as the percent bonded. Glass that has adhered to silicon is easily observed by visual inspection.

Anodic bonds of Pyrex to silicon at temperatures below 300° C. have not been documented in the current anodic bond literature. As a matter of fact, there has been some reference to anodic bonds at temperatures below 300° C. as being kinetically impractical for commercial applications, M. Harz, and H. Engelke. "Curvature Changing or Flattening of Anodically Bonded Silicon and Borosilicate Glass," *Sensors and Actuators*, Vol. 64A, (1998) 95–100. Experimental confirmation of the time dependence with respect to temperature during anodic bonding of untreated Pyrex wafers has been verified according to FIG. 3. Clearly, as the temperature is lowered to temperatures below 320° C., the time to complete an anodic bond increases significantly. Furthermore, attempts to bond untreated Pyrex at 280° C. with a voltage of 500VDC have been unsuccessful.

Using the apparatus of FIG. 2, samples were anodically bonded for 10 minutes with an applied voltage of 2000VDC (Table 2). For each temperature, two replicates were run. Bond quality was tested using the razor blade technique. As shown in Table 2, lithium-exchanged Pyrex exhibited superior bonding qualities overall other treatments. At both 230 and 250° C., lithium-exchanged Pyrex formed 100% anodic bonds. Anodic bonds did not form at 230° C. for untreated samples. At 250° C., only 90% of the sample bonded. Proton-exchanged Pyrex also exhibited better bonding qualities than untreated Pyrex. At 220° C., 25% of the sample bonded, and at 240° C. 100% of the sample bonded.

TABLE 2

| Treatment | Temperature (° C.) | Area Bonded (%) |
| --- | --- | --- |
| None | 230 | 0 |
| None | 250 | 90 |
| Lithium | 230 | 100 |
| Lithium | 250 | 100 |
| Proton | 220 | 25 |
| Proton | 240 | 100 |

Lithium-exchanged Pyrex also exhibited superior bonding characteristics over untreated Pyrex when voltages lower than 500VDC were applied at temperatures ranging between 280 and 320° C. Lithium-exchanged Pyrex bonded at 280° C. with an applied voltage of 500VDC while a bond for untreated Pyrex did not form under the same operating conditions. Furthermore, lithium-exchanged Pyrex formed bonds at 320° C. when a voltage of 200VDC was applied. A bond did not form for untreated Pyrex under the same operating conditions.

Experiments have also been conducted to demonstrate that the ion exchange technique of the present invention also works for, for example, six inch wafers that are bonded using a commercial bonder at low voltage, namely 200VDC, and 310° C., as well as at low temperature, namely 250° C., and 2000VDC, in both instances in less than 10 minutes.

Six inch, ¼inch thick Pyrex 7740 wafers were lithium treated for ion exchange for 45 minutes at 325° C. 250 grams of lithium nitrate were used for the ion exchange. The treated samples were then subjected to a Turgitol (Union Carbide of Danbury, Conn.) semiconductor surfactant scrub with clean room Texwipe (Texwipe Co. LLC, Upper Saddle River, N.J.) for 1 minute, and were then rinsed with deionized water. To further clean the treated Pyrex wafers, 2030 ml of $H_2SO_4$ (96% sulfuric acid) was placed in a large quartz bowl. 870 ml of $H_2O_2$ (30% hydrogen peroxide) was rapidly poured in the sulfuric acid. The treated Pyrex wafer samples were then etched by the aforementioned mixture for 10 minutes for cleaning. The etched Pyrex wafers were then removed from the solution and again rinsed with deionized water, this time for 10 minues.

Anodic bonding was then effected using a Wafer Fusion Bonder Model EVG-520 under the bonding parameters provided in the following Table 3. Good bonds were formed on all samples.

TABLE 3

| Treatment | Temperature ° C. | Voltage, Volts | Time, minutes | Piston Force N | Chamber Pressure (Millibars) |
|---|---|---|---|---|---|
| Li Treated | 250 | 760 | 15 | 100 | 0.001 |
| Li Treated | 225 | 1500 | 15 | 100 | 0.001 |
| Li Treated | 200 | 2000 | 20 | 100 | 0.001 |

Low temperature, in other words below 280° C., and low voltage, in other words below 500VDC, anodic bonds form with the use of Pyrex glass that has been surface modified pursuant to the present invention. In particular, experiments were conducted with Pyrex glass pretreated in either a molten lithium nitrate or ammonium hydrogen sulfate bath. For lithium-exchanged Pyrex, anodic bonds were formed with silicon at temperatures as low as 230° C. with an applied voltage of 2000VDC within 10 minutes. Similarly, proton-exchanged Pyrex formed anodic bonds at temperatures as low as 240° C. when a potential of 2000VDC was applied for 10 minutes. Furthermore, low voltage anodic bonds readily form when lithium-exchanged Pyrex is used as opposed to untreated Pyrex.

The present invention is, of course, in no way restricted to the specific disclosure of the specification and drawing, but also encompasses any modifications within the scope of the appended claims.

What we claim is:

1. A method of anodically bonding glass and semiconducting material together, including the steps of:

immersing a glass sample in a molten salt bath for a fixed period of time to modify the surface of the glass sample via ion exchange, wherein said salt is a lithium salt or a proton source;

removing the glass sample from the salt bath;

subsequently placing the glass sample and semiconducting material onto one another;

heating the glass and semiconducting material to a temperature of between 100° C. and 500° C.; and while at said temperature, applying a potential across the glass and semiconducting material for a fixed period of time to effect anodic bonding together of the glass and semiconducting material.

2. A method according to claim 1, wherein the salt is selected from the group consisting of lithium nitrate, ammonium hydrogen sulfate, lithium sulfate, other lithium salts, and protonating salts.

3. A method according to claim 2, wherein the glass is selected from the group consisting of soda silicate, soda lime silicate, boro silicate, and alumino silicate.

4. A method according to claim 2, wherein the semiconducting material is silicon or gallium arsenide.

5. A method according to claim 1, wherein the molten bath is at a temperature of from 145 to 600° C.

6. A method according to claim 5, wherein the glass sample is immersed for 0.01–24 hours.

7. A method according to claim 5, which includes the step of cooling the glass sample to room temperature after the removing step.

8. A method according to claim 1, which includes the step of rinsing the glass sample with deionized water after the removing step.

9. A method according to claim 1, which includes the step of washing the glass sample with a strong acid solution after the removing step.

10. A method according to claim 1, wherein the step of applying a potential comprises applying a voltage of 50–2000VDC.

11. A method according to claim 10, wherein potential is applied for 0.01 minutes to 60 minutes.

* * * * *